United States Patent
Sole et al.

(10) Patent No.: US 9,671,998 B2
(45) Date of Patent: Jun. 6, 2017

(54) SYNCHRONISED CONTROL

(71) Applicant: QUALCOMM TECHNOLOGIES INTERNATIONAL, LTD., Cambridge (GB)

(72) Inventors: Jonathon Sole, Cambridge (GB); Benjamin Campbell, Bury St Edmunds (GB); Harith Haboubi, Cambridge (GB)

(73) Assignee: QUALCOMM Incorporated, San Diego, CA (US)

( * ) Notice: Subject to any disclaimer, the term of this patent is extended or adjusted under 35 U.S.C. 154(b) by 47 days.

(21) Appl. No.: 14/587,595

(22) Filed: Dec. 31, 2014

(65) Prior Publication Data

US 2016/0188287 A1  Jun. 30, 2016

(51) Int. Cl.
| | |
|---|---|
| *H04B 3/00* | (2006.01) |
| *H03G 3/00* | (2006.01) |
| *G06F 3/16* | (2006.01) |
| *H04R 3/00* | (2006.01) |
| *H04R 3/12* | (2006.01) |
| *H04R 5/04* | (2006.01) |
| *H04S 3/00* | (2006.01) |
| *H04L 12/18* | (2006.01) |

(52) U.S. Cl.
CPC ............ *G06F 3/165* (2013.01); *H03G 3/00* (2013.01); *H04R 3/00* (2013.01); *H04R 3/12* (2013.01); *H04R 5/04* (2013.01); *H04S 3/008* (2013.01); *H04L 12/189* (2013.01); *H04R 2227/005* (2013.01); *H04R 2420/07* (2013.01); *H04R 2430/01* (2013.01); *H04S 2400/13* (2013.01)

(58) Field of Classification Search
CPC .. G06F 3/165; H03G 3/00; H04R 3/00; H04R 2227/005; H04R 2420/07; H04R 2430/01; H04H 2201/11; H04H 2201/20
USPC .......................................... 381/77; 455/3.06
See application file for complete search history.

(56) References Cited

U.S. PATENT DOCUMENTS

| | | | | |
|---|---|---|---|---|
| 5,406,634 | A | * | 4/1995 | Anderson .............. H04R 27/00 381/80 |
| 6,466,832 | B1 | | 10/2002 | Zuqert et al. |
| 2004/0223622 | A1 | | 11/2004 | Lindemann et al. |
| 2006/0153155 | A1 | | 7/2006 | Jacobsen et al. |
| 2007/0110074 | A1 | * | 5/2007 | Bradley ............ H04L 29/06027 370/395.51 |
| 2008/0254751 | A1 | * | 10/2008 | Lazaridis ............ H04M 1/7253 455/74 |

(Continued)

FOREIGN PATENT DOCUMENTS

| | | |
|---|---|---|
| WO | 9729550 A1 | 8/1997 |
| WO | 0076272 A1 | 12/2000 |

OTHER PUBLICATIONS

International Search Report and Written Opinion—PCT/IB2015/059636—ISA/EPO—Feb. 25, 2016.

*Primary Examiner* — Vivian Chin
*Assistant Examiner* — Ammar Hamid
(74) *Attorney, Agent, or Firm* — The Marbury Law Group

(57) ABSTRACT

A device capable of operating according to a wireless communications protocol, the device being configured to: receive audio data from an audio data source; generate volume control data for controlling the playback volume of the audio data; encapsulate the audio data and volume control data in a broadcast packet; and broadcast the packet in accordance with the wireless communications protocol.

16 Claims, 4 Drawing Sheets

(56) References Cited

U.S. PATENT DOCUMENTS

| | | | | |
|---|---|---|---|---|
| 2012/0087503 A1* | 4/2012 | Watson | ................... | H04S 3/008 381/23 |
| 2015/0189426 A1* | 7/2015 | Pang | ....................... | H04M 1/21 381/77 |
| 2016/0100206 A1* | 4/2016 | Beckhardt | .............. | H04N 21/65 725/25 |

* cited by examiner

SYNCHRONISED CONTROL

FIELD OF THE INVENTION

This invention relates to synchronously controlling the playback of media at multiple devices.

BACKGROUND

The ability to communicate data wirelessly has led to many new and improved applications and devices. Some systems which traditionally were wired are now being improved by replacing the wires with wireless capabilities. For example, traditional 5.1 surround sound systems require 6 speakers to be located in different parts of a room and to be wired to a central receiver. Many users have found that the cabling required to install such a system to be very inconvenient and cumbersome. Thus multi-speaker systems have been provided with wireless capability which allows users to easily install and use the systems.

Some wireless multi-speaker systems employ a hub which is wirelessly connected to the speakers in the system. The hub can store a user's music collection and can wirelessly send the stored music for playback to the speakers in the system. A user can select the music to be output by the speakers via, for example, a user interface on the hub or a device connected to the hub.

Typically such systems employing a hub operate in a proprietary network. Such a proprietary system provides the proprietor with flexibility, control and freedom to implement different functions with their proprietary devices. However, a problem with such proprietary systems is that they may not be compatible with devices from other vendors. This can restrict other vendors from manufacturing devices (such as additional speakers or media sources) for use in the wireless speaker system and thus also restricts consumer choice. Furthermore, initial configuration of such systems are often complicated and time-consuming for a user. There is therefore a need for a technique of communicating media so that a multitude of playback devices are able to play the media back in a simple, easy and controlled manner.

SUMMARY OF THE INVENTION

According to one aspect, there is provided a device capable of operating according to a wireless communications protocol, the device being configured to: receive audio data from an audio data source; generate volume control data for controlling the playback volume of the audio data; encapsulate the audio data and volume control data in a broadcast packet; and broadcast the packet in accordance with the wireless communications protocol.

The volume data may be generated in dependence on a time for playing the audio data.

The device may comprise a playback device configured to receive the audio data and the volume data and play the audio data at a volume level dependent on the volume control data.

The broadcast may be unidirectional.

The wireless communications protocol may be Bluetooth. The broadcast may be a connectionless slave broadcast.

The broadcast packet may comprise a first portion for the audio data and a second portion for the volume control data.

The volume control data may represent a volume level in dB, dBm, dBfs or dBV.

The volume control data may be generated in dependence on a user input.

According to another aspect, there is provided a device capable of operating according to a wireless communications protocol, the device being configured to: receive a broadcast packet broadcasted in accordance with the wireless communications protocol, wherein the broadcast packet comprises audio data and volume control data; decode the audio data; determine a volume level for playing the decoded audio data in dependence on the volume control data; and play the decoded audio data at the determined volume level.

The broadcast packet may comprise a time for playing the audio and the device is configured to play the decoded audio at that time.

The device may comprise a user interface for setting a volume level for playing audio.

The volume level for playing the decoded audio may be determined further in dependence on the volume level set by the user interface.

The device may be configured to analyse the volume control data and, in dependence on that analysis, disregard the volume level set by the user interface.

The wireless communications protocol may be Bluetooth.

The broadcast packet may be received via a connectionless slave broadcast.

According to yet another aspect, there is provided a method of playing an audio stream comprising: receiving a stream of packets, each packet comprising one or more audio frames representing an audio stream and volume control data associated with the one or more frames, the stream of packets being broadcasted in accordance with a wireless communications protocol; setting a playback volume for each audio frame in dependence on the volume control data comprised in the same packet as the audio frame; playing each audio frame of the audio stream at the playback volume set for that frame.

The wireless communications protocol may be Bluetooth.

The stream of packets may be received via a connectionless slave broadcast.

Each packet may comprise time data indicating a time for playing each frame and each audio frame is played at the time indicated for that audio frame.

BRIEF DESCRIPTION OF THE DRAWINGS

The present invention will now be described by way of example with reference to the drawings. In the drawings.

DETAILED DESCRIPTION

The following description is presented to enable any person skilled in the art to make and use the invention, and is provided in the context of a particular application. Various modifications to the disclosed embodiments will be readily apparent to those skilled in the art.

The general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The following describes wireless communication devices for broadcasting data and receiving that broadcasted data. That data is described herein as being transmitted in packets and/or frames and/or messages. This terminology is used for convenience and ease of description. Packets, frames and messages have different formats in different communications protocols. Some communications protocols use different terminology. Thus, it will be understood that the terms "packet" and "frame" and "messages" are used herein to denote any signal, data or message transmitted over the network.

Figure 1:
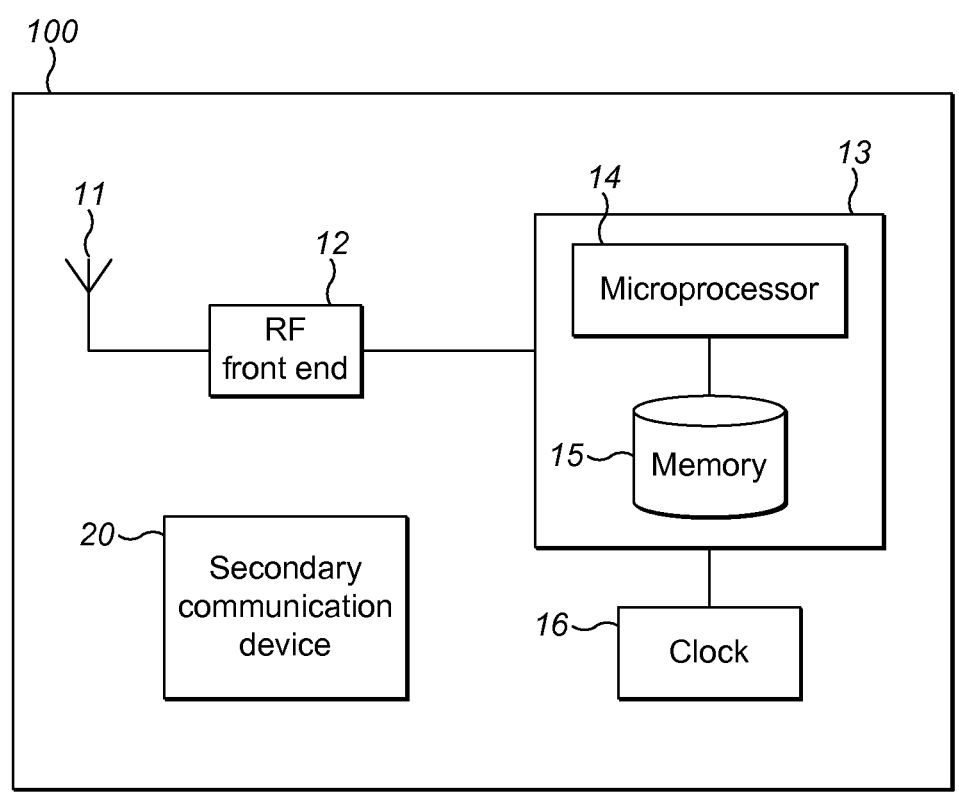
FIG. 1 illustrates a wireless communication device.

FIG. 1 shows the architecture of a wireless communication device 100 capable of operating according to a communication protocol. The device 100 comprises an antenna 11, a radio frequency (RF) front end 12 and a baseband processor 13. The baseband processor 13 comprises a microprocessor 14 and a non-volatile memory 15. The non-volatile memory 15 stores in non-transitory form program code that is executable by the microprocessor to cause the baseband processor to implement the communications protocol of the device and the methods described herein.

In order to transmit signals the processor 13 can drive the RF front end 12, which in turn causes the antenna 11 to emit suitable RF signals. Signals received at the antenna 11 can be pre-processed (e.g. by analogue filtering and amplification) by the RF front end 12, which presents corresponding signals to the processor 13 for decoding. The processor can respond to those signals in various ways, as will be described in more detail below. The device 100 also comprises a clock 16, which can be turned on or off by the microprocessor 14 in order to save power. The RF front end 12 and the baseband processor 13 could be implemented on one or more integrated circuits.

In the case that the device 100 operates according to two or more communications protocols, it may have separate transceiver circuitry for each communications protocol, in which case the device of FIG. 1 would additionally have a further antenna, RF front end and baseband processor for each communications protocol that it supports. Alternatively, one or more of the antenna, RF front end and baseband processor may be shared by two or more of the communications protocols that the device is configured to communicate with. FIG. 1 shows a secondary communication device 20 to illustrate support for a second communication protocol. In an example, device 100 may be based on the Bluetooth protocol. Examples of the protocols that could be supported by the secondary device 20 include protocols such as IEEE 802.11, Ethernet, USB, DAB, etc.

The Bluetooth communications protocol is commonly used for many wireless applications between portable and computing devices and the like. It is increasingly being used in domestic applications for functions such as streaming or playing back audio and/or video data and other multi-media applications such as gaming using portable gaming devices. The methods and devices described below will be described with reference to devices that can operate in accordance with a Bluetooth communications protocol. The general principles described below can be applied to devices and systems operating according to other communications protocols such as Wi-Fi, Zigbee, etc.

Figure 2:
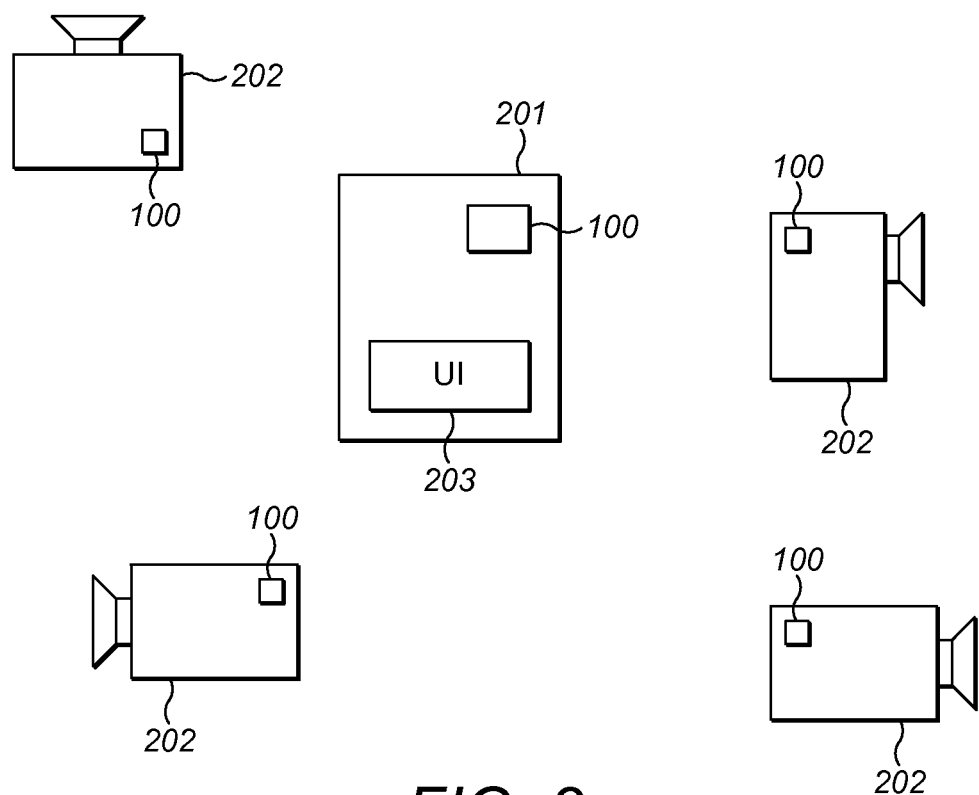
FIG. 2 illustrates a wireless speaker system.

FIG. 2 shows an example of a multi-speaker system 200. The system 200 comprises a hub device 201 and one or more remote devices 202. The hub device 201 and the remote devices 202 each comprise a wireless communication device (such as device 100) that operates according a wireless communications protocol (e.g. Bluetooth).

The hub device 201 may be connected to a media source (not shown). The media source may be, for example, an internal storage device (e.g. flash memory, hard disk), a removable storage device (e.g. memory card, CD), a networked storage device (e.g. network drive or the cloud), an internet media provider (e.g. a streaming service), radio (e.g. DAB), a microphone, etc. The media source may be accessible via device 100 or other suitable interfaces (e.g. USB, analogue line-in, I2S, S/PDIF, Bluetooth, Ethernet, Wi-Fi, DAB, etc.). Hub device 201 may be, for example, a smartphone, tablet, PC, laptop, smartwatch, smart glasses, speaker, smart TV, AV receiver, mixer, games console, games controller, media hub, set-top box, Hi-Fi, etc.

Each remote device 202 (and, optionally, the hub device 201) comprises (or is connected to) a media output such as a speaker, display, vibration feedback motor, etc. for playing media. Speakers are depicted in FIG. 2 as an example. The media output may be connected to the wireless communication device 100 and/or a media source to receive media for playback. The example of FIG. 2 shows four remote devices 202. However, many more remote devices (e.g. tens, hundreds, even thousands) can be added to the system 200, as will be explained below. The remote devices 202 may be, for example, stand-alone speakers or integrated into other devices such as smartphones, TVs, docking stations, Hi-Fis, smart watches, smart glasses, virtual reality headsets, etc.

The hub device 201 may comprise a user interface (UI) 203. The user interface 203 may be, for example, a touch screen, one or more buttons, a microphone for receiving voice commands, a camera for receiving user gestures, a peripheral device such as a mouse, etc. The user interface 203 allows a user to select and control the media that is to be played back by the remote devices 202 (and the hub device, if provided with a media output). For example, a user may select the music to be played back, start/stop the music, adjust a volume level for the music, etc. via the user interface 203. Alternatively or additionally, user commands made on a user interface on another device may be communicated to the hub device 201. For example, user commands may be sent to the hub device 201 from an application running on a smartphone.

As mentioned above, hub device 201 may comprise (or be connected to) a media source. Media from the media source may be audio that is selected (via the user interface 203 for example) for playback. The hub device 201 and the remote devices 202 may be capable of encoding and decoding audio according to one or more codecs. The hub device 201 may convert media from one format to another format that is suitable for broadcasting to the remote devices 202. For example, the bandwidth for a broadcast may be limited and so a suitable codec may be selected that encodes and compresses media so that it is able to broadcast the media within the available bandwidth at a required level of quality and handles lost frames gracefully. Preferably, a suitable codec provides low coupling between frames, a low bitrate and packet loss concealment. An example of a suitable codec is Constrained Energy Lapped Transform (CELT) or Opus. Other suitable codecs may be used. For example, the hub device 201 may receive PCM audio (which has a high bitrate) as its source media and converts that PCM audio to CELT (which has a lower bitrate) and transmits the CELT encoded data to the remote devices 202. The media may be encoded into a series of frames, which may be of fixed or variable size. The media data may be compressed.

In conventional wireless multi-speaker systems, a direct connection is usually provided between each speaker and a central controller (such as a hub or central speaker). Each connection is used to communicate data (such as audio data and control data) between the central controller and speaker. Control functions (e.g. pausing, volume control, etc.) are usually achieved by providing a dedicated control channel or packets for each speaker connection. The audio data is conventionally sent in a different channel or packets. In some cases where the wireless connection is lossy or suffers from interference, some control packets or audio packets may not be received by all of the speakers. This may lead to the audio and the control of that audio to be out of sync for some or all of the speakers. In one aspect of the present invention, the control data is provided in the same packet as the audio data, which maintains the synchronisation of the control for that audio, as further described below.

Figure 3:
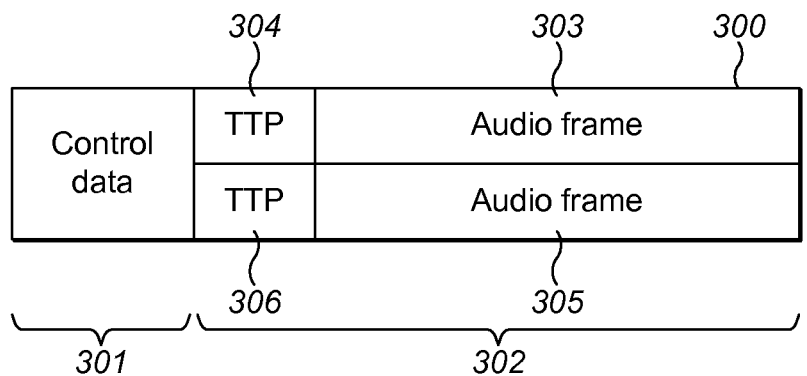
FIG. 3 illustrates a packet format for the wireless speaker system.

The media broadcasted by the hub device may be received by as many remote devices 202 within the coverage area of the hub device. FIG. 3 shows an example structure of the broadcast packet 300. The broadcast packet 300 comprises a section 301 for control data and a section 302 for media data. Media section 302 may comprise one or more media frames. As an example, FIG. 3 depicts two audio frames 303 and 305. The hub device 201 encapsulates one or more audio frames and control data for those frames in the broadcast packet 300. In some cases, no audio frames are encapsulated and broadcast and only control data is encapsulated and broadcast. In this case, the control data may be used to synchronously control non-audio features when audio is not playing (e.g. whilst setting up the audio stream or between tracks).

Packet 300 is broadcasted by the hub device 201. Any remote device 202 that is within range of the broadcast may receive the broadcasted packet. As each remote device 202 receives the same broadcasted packet, the same audio frame can be played back by each of the speakers. Preferably, the hub device 201 is configured to broadcast packet 300 in accordance with the connectionless slave broadcast (CSB) feature of the Bluetooth Core Specification Addendum 4. Preferably, each remote device 202 is configured to receive CSB broadcasts.

The Connectionless Slave Broadcast mode is a feature of Bluetooth which enables a Bluetooth piconet master to broadcast data to any number of slave devices. This is different to normal Bluetooth operations, in which a piconet is limited to eight devices: a master and seven slaves. In the CSB mode, the master device reserves a specific logical transport for transmitting broadcast data. That broadcast data is transmitted in accordance with a timing and frequency schedule. The master transmits a synchronisation train comprising this timing and frequency schedule on a Synchronisation Scan Channel. In order to receive the broadcasts, a slave device first implements a synchronisation procedure. In this synchronisation procedure, the slave listens to the Synchronisation Scan Channel in order to receive the synchronisation train from the master. This enables it to determine the Bluetooth clock of the master and the timing and frequency schedule of the broadcast packets. The slave synchronises its Bluetooth clock to that of the master for the purposes of receiving the CSB. The slave device may then stop listening for synchronisation train packets. The slave opens it's receive window according to the timing and frequency schedule determined from the synchronisation procedure in order to receive the CSB broadcasts from the master device.

The CSB is connectionless and thus there is no connection between the hub device 201 and the remote device 202. Unlike a standard Bluetooth connection there is no connection made between CSB devices. CSB may be considered to be unreliable as devices receiving a broadcast may not be able to acknowledge receipt of the packets sent in the broadcast or request a re-transmission of packets as CSB is unidirectional.

Providing control data in the same packet as media data (e.g. in broadcast packet 300) allows the remote device 202 to control that media as intended by the hub device 201. As mentioned above, in the conventional systems, however, control data for media may not be received (or not received in a timely manner), which can cause the control of the media to be out of sync.

The control data section 302 may comprise control data for the audio frames in the audio section 302 of the packet 300. For example, the control data section 302 of each packet 300 may comprise volume control data for the audio frames contained in the audio section 302 of that packet. Other control data for the audio frames may be included in section 301 such as commands (e.g. play, pause, stop, etc.), playback rates, equalisation data, etc. As each remote device 202 receives the same broadcasted packet, the same actions arising from the control data can be carried out for each frame by each of the devices 202 at the same time.

Preferably, the control data section 301 of each packet that is broadcast comprises volume control data. The volume control data controls the volume level for the audio frames that are in the same packet. In a stream of packets, for example, each of the packets will have volume control data for setting the volume level of the frames in the same packet. As each packet in the stream is broadcast, each remote device 202 is capable of receiving the same packets and so the devices are capable of synchronously controlling the volume level of the audio that is to be played. This allows a user to control the volume that is output by all of the devices 202 via a single input at the user interface 203.

In a case where there are multiple frames provided in audio section 302, there may be different control data in section 301 for each of the multiple frames or single and the same control data for all of the frames. For example, different volume levels may be set for different frames within the same packet or the same volume level may be set for all of the frames in same packet.

As mentioned above, CSB may be considered to be unreliable as the broadcast is unidirectional and the remote devices may not be able to provide acknowledgements or request retransmission of packets that are not correctly received. Thus some packets may not be received by some of the remote devices 202 and the devices 202 may fail to receive different packets. If, for example, volume control was provided for in separate dedicated control packets (rather than in the same packet as the audio), then the unreliably of receiving control packets may cause the speakers to play the same audio at different volume levels. However, by providing audio data along with the volume control data that controls the volume level of that audio, each remote device 202 (that receives the packet) will play that segment of audio at the same volume level as the other devices 202.

Each media frame provided in the broadcast packet 300 is associated with data which represents a time for playing out that frame. This time to play (TTP) data may, for example, be provided in a header of the media frame. This is illustrated in FIG. 3 where the media section 302 comprises two audio frames, each of which having TTP data 304 and 306 in its header and respective audio data in its payload 303 and 305. The hub device 201 determines a TTP for each audio frame, which indicates a time at which that the audio data in the audio frame should be played out. The TTP data may be an absolute time that is derived from the Bluetooth clock (e.g. clock 16) of the hub device 201. Each remote device 202 may synchronise its Bluetooth clock (e.g. clock 16) to the hub device 201 Bluetooth clock. As each remote device 202 receives the same broadcast packet 300, each audio frame is played synchronously and controlled synchronously by the devices 202 at the time indicated by the TTP.

Each remote device 202 that receives a broadcast packet 300 is configured to decode the audio frame or frames in the audio section 302 of the packet and determine a volume level for those frames based on the volume control data contained in the control data section 301 of the same packet. The devices 202 then play each segment of decoded audio at its determined volume level at the TTP for that segment. The volume control data may be a level in, for example, dB, dBv, dBm, dBfs, W or any other unit that is able to express a relative or absolute sound pressure level to be output for the audio frames associated with the control data.

Each remote device 202 may comprise a user interface (not shown) which can control playback of the received audio. For example, the device 202 may have a user interface for volume control. In that case, the received volume control data may specify volume level relative to the volume level set by the user interface at the device 202. Thus, the playback volume level for received audio may be dependent on the volume level specified by the user interface at the device 202 and then adjusted in dependence on the received volume control data. Alternatively, the volume control data may specify an absolute power level at which the audio should be output. In that case, the volume level set by the user interface at the device 202 may be disregarded and the received audio is played out at the specified power level. This allows different remote devices 202 with speakers that operate at different powers to all synchronously output audio at the same power.

The volume control data may be generated in dependence on a user input at user interface 203, as mentioned above. The volume control data may be generated so that the volume levels at the remote devices 202 synchronously ramp up to the level set by the user. For example, at the start of playback it may be desirable for the listener experience to gradually ramp up the volume of the audio output by each device 202 up to a level instead of suddenly playing at that level. The volume control data can be set such that, for a predetermined period of time starting from the first audio frame to be played back, the devices 202 gradually increase the playback volume. The frames that fall within the predetermined time may be determined based on the TTP data of that frame. Thus, the volume control data may be set based on the TTP of the frames in the same packet as the volume control data. For example, the volume level for a series of consecutive audio frames can be set such that it increases with the time indicated by the TTP for those frames. Similarly, the volume control data may be set so that volume may be ramped down when the audio ends.

New remote devices 202 may enter or leave the system 200 whilst the hub device 201 is broadcasting without affecting that broadcast. As the broadcast is unidirectional, the hub device 201 is unaffected by the devices 202 that receive its broadcast. Thus, remote devices 202 can easily and simply be added or removed to or from the system 200 without the need to reconfigure the hub device 201. When a new remote device 202 enters the coverage area of the hub device 201, the device may start playing the broadcasted audio. At the start of play, rather than immediately playing that the volume set by the received volume control data, the new device 202 may gradually ramp up the output volume to the level specified by the volume control data in order avoid sudden loud playback.

Figure 4:
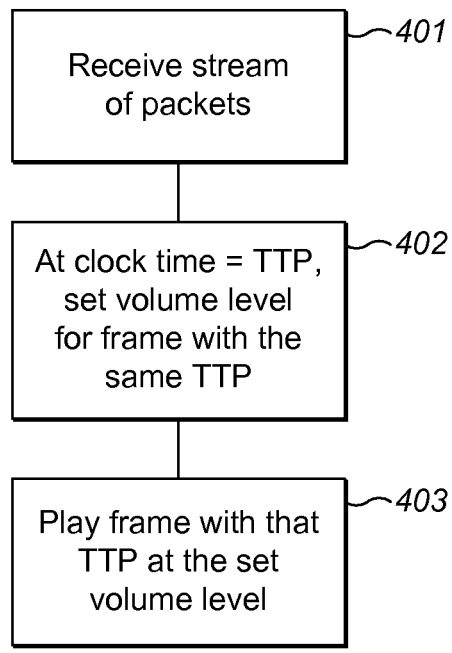
FIG. 4 illustrates a process for playing an audio stream.

FIG. 4 shows an example flow diagram for playing an audio stream. At step 401, a stream of packets (e.g. packet 300) is received at a device. Each packet comprises one or more audio frames representing the audio stream and volume control data associated with each of those frames. Each packet may comprise TTP data that indicates a time for playing each of the frames, as described above. The stream of packets may be broadcasted in accordance with CSB, as described above. At step 402, when a clock at the device ticks to the time for playing one of the frames, the play back volume is set at the device according the volume control data for that frame. At step 403, that frame is played out at the set playback volume. Steps 402 and 403 are repeated for subsequent frames when the clock ticks to subsequent corresponding TTPs.

Figure 5:
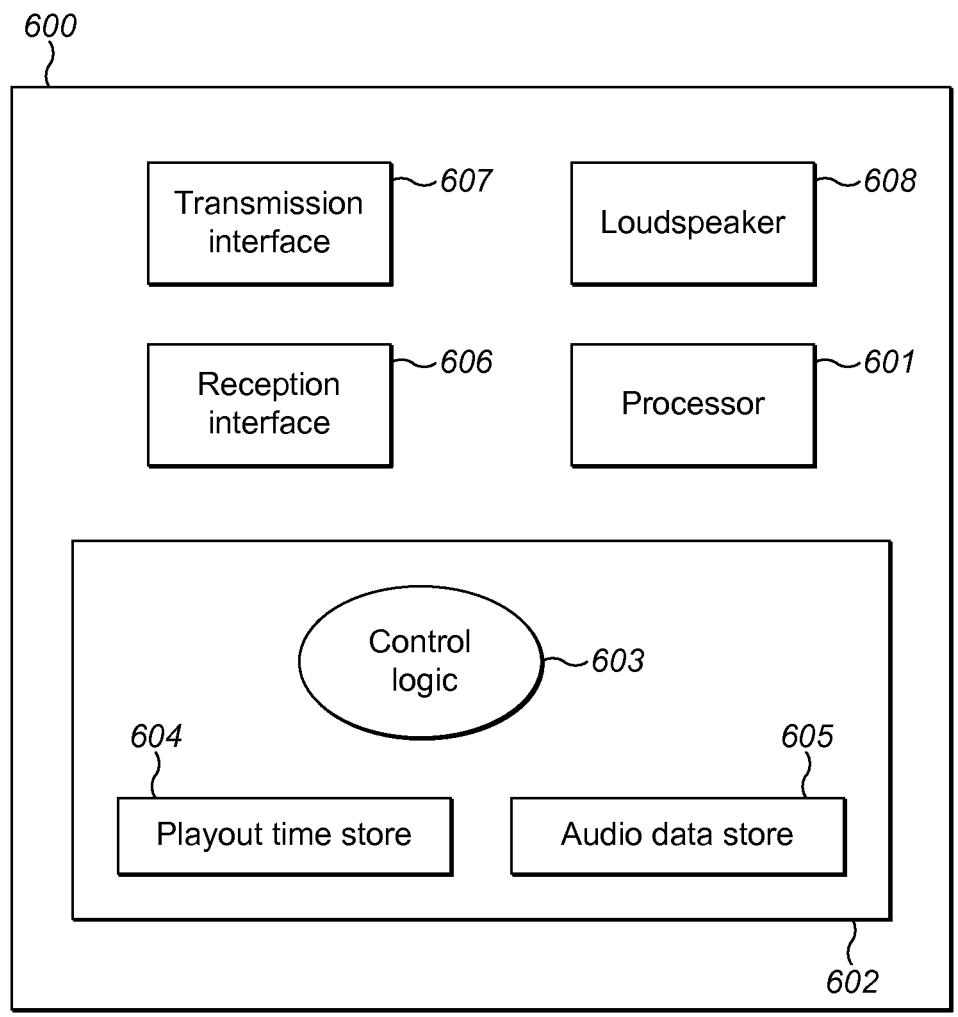
FIG. 5 illustrates a computing device.

Reference is now made to FIG. 5. FIG. 5 illustrates a computing-based device 600 in which the described remote device can be implemented. The computing-based device may be an electronic device. The computing-based device illustrates functionality used for storing the media data and control data of received frames, and for controlling the playback of the media data of the received frames.

Computing-based device 600 comprises a processor 601 for processing computer executable instructions configured to control the operation of the device in order to perform the synchronous playback can control of received media. The computer executable instructions can be provided using any non-transient computer-readable media such as memory 602. Further software that can be provided at the computer-based device 600 includes control logic 603 which implements that control functions (e.g. volume control) for the media, as mentioned above. Alternatively, the control may be implemented partially or wholly in hardware. Store 604 stores the play out times of the media frames and control functions. Store 605 stores the media data of the media frames. Computing-based device 600 further comprises a reception interface 606 for receiving the broadcast audio from the hub device. The receiver may be the wireless communication device 100 described above, which includes a clock. The computing-based device 600 may additionally include transmission interface 607. The computing-based device 600 also comprises a media output such as loudspeaker 608 for playing the audio out locally at the play out time.

The structure shown in FIG. 1 is intended to correspond to a number of functional blocks in an apparatus. This is for illustrative purposes only. FIG. 1 is not intended to define a strict division between different parts of hardware on a chip or between different programs, procedures or functions in software. In some embodiments, some or all of the algorithms described herein may be performed wholly or partly in hardware. In other implementations, the algorithms may be implemented by a processor acting under software control. Any such software is preferably stored on a non-transient computer readable medium, such as a memory (RAM, cache, hard disk etc.) or other storage means (USB stick, CD, disk etc.).

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A device capable of operating according to a wireless communications protocol, comprising:
   a user interface configured to generate volume control data for controlling a playback volume at a predetermined playback time for audio data received from an audio data source;
   an encoder configured to encapsulate the audio data, the predetermined playback time for the audio data, and the volume control data in a broadcast packet, wherein the broadcast packet comprises a first portion containing the audio data, a second portion containing the predetermined playback time, and a third portion containing the volume control data that controls the playback volume at the predetermined playback time for the audio data included in the broadcast packet; and
   a transmitter configured to broadcast the broadcast packet in accordance with the wireless communications protocol.

2. The device of claim 1, wherein the device comprises a media output configured to receive the volume control data and play the audio data at a volume level dependent on the volume control data.

3. The device of claim 1, wherein the broadcast is unidirectional.

4. The device of claim 1, wherein the wireless communications protocol is Bluetooth.

5. The device of claim 4, wherein the broadcast is a connectionless slave broadcast.

6. The device of claim 1, wherein the volume control data represents a volume level in dB, dBm, dBfs or dBV.

7. The device of claim 1, wherein the volume control data is generated in dependence on a user input.

8. A device capable of operating according to a wireless communications protocol, comprising:
   a receiver configured to receive a broadcast packet broadcasted in accordance with the wireless communications protocol, wherein the broadcast packet comprises a first portion containing audio data, a second portion containing a predetermined playback time for the audio data, and a third portion containing volume control data that controls a playback volume at the predetermined playback time for the audio data included in the broadcast packet;
   a decoder configured to decode the audio data;
   a processor configured to determine a volume level for playing the decoded audio data at the playback time in dependence on the volume control data; and
   a media output configured to play the decoded audio data at the determined volume level at the playback time for the audio data.

9. The device of claim 8, wherein the device comprises a user interface for setting a volume level for playing the decoded audio data.

10. The device of claim 9, wherein the volume level for playing the decoded audio is determined further in dependence on the volume level set by the user interface.

11. The device of claim 9, wherein the processor is further configured to analyze the volume control data and, in dependence on that analysis, disregard the volume level set by the user interface.

12. The device of claim 1, wherein the wireless communications protocol is Bluetooth.

13. The device of claim 12, wherein the broadcast packet is received via a connectionless slave broadcast.

14. A method of playing an audio stream comprising:
   receiving a stream of packets, each packet comprising a first portion containing one or more audio frames representing an audio stream, a second portion containing a predetermined playback time for each of the one or more audio frames, and a third portion containing volume control data that controls a playback volume at the predetermined playback time for each of the one or more audio frames included in that packet, the stream of packets being broadcasted in accordance with a wireless communications protocol;
   setting a playback volume for playing each of the one or more audio frames at the predetermined playback time in dependence on the volume control data comprised in the same packet as the one or more audio frames;
   playing each of the one or more audio frames of the audio stream at the playback volume set for that audio frame.

15. The method of claim 14, wherein the wireless communications protocol is Bluetooth.

16. The method of claim 15, wherein the stream of packets are received via a connectionless slave broadcast.

* * * * *